(12) United States Patent
Gupta et al.

(10) Patent No.: US 11,293,954 B2
(45) Date of Patent: Apr. 5, 2022

(54) VOLTAGE SENSING CIRCUIT

(71) Applicant: TEXAS INSTRUMENTS INCORPORATED, Dallas, TX (US)

(72) Inventors: Naman Gupta, Faridabad (IN); Rajat Chauhan, Bangalore (IN); Santhosh Kumar Srinivasan, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 164 days.

(21) Appl. No.: 16/363,779

(22) Filed: Mar. 25, 2019

(65) Prior Publication Data
US 2020/0018782 A1 Jan. 16, 2020

(30) Foreign Application Priority Data

Jul. 12, 2018 (IN) .............................. 201841026010

(51) Int. Cl.
*G01R 19/165* (2006.01)
*G01R 31/382* (2019.01)
*G05F 3/26* (2006.01)
*H03K 3/037* (2006.01)

(52) U.S. Cl.
CPC . *G01R 19/16519* (2013.01); *G01R 19/16523* (2013.01); *G01R 31/382* (2019.01); *G05F 3/262* (2013.01); *H03K 3/0377* (2013.01)

(58) Field of Classification Search
CPC ................ G01R 19/165; G01R 31/382; G01R 19/16519; G01R 19/16523; G01R 19/16552; G01R 19/0084; G01R 19/16542; G01R 31/3835; G05F 3/26; G05F 3/262; H03K 3/037; H03K 3/0377

USPC ........................................................ 324/76.11
See application file for complete search history.

(56) References Cited

U.S. PATENT DOCUMENTS

| 2009/0040843 | A1* | 2/2009 | Sprouse | G11C 16/225 365/189.16 |
| 2013/0044528 | A1* | 2/2013 | Kaneda | H03K 17/04123 363/132 |
| 2017/0288532 | A1* | 10/2017 | Zhou | H02M 1/36 |
| 2018/0145676 | A1* | 5/2018 | Tran | H03K 19/017509 |

OTHER PUBLICATIONS

Texas Instruments, "TPS383x 150-nA, Ultralow Power, Supply Voltage Monitor," TPS3831, TPS3839, SBVS193D—Jun. 2012—revised Jul. 2015, 34 p.

* cited by examiner

Primary Examiner — Jermele M Hollington
Assistant Examiner — Courtney G McDonnough
(74) Attorney, Agent, or Firm — Valerie M. Davis; Charles A. Brill; Frank D. Cimino

(57) ABSTRACT

Aspects of the disclosure provide for a circuit. In some examples, the circuit includes a Zener diode, a first current source, a first n-type field effect transistor (FET), a first inverter circuit, and a second current source. The Zener diode has a cathode coupled to a first node and an anode coupled to a second node. The first current source has a first terminal coupled to the second node and a second terminal coupled to a ground terminal. The first n-type FET has a gate terminal coupled to the second node, a source terminal coupled to the ground terminal, and a drain terminal coupled to a third node. The first inverter circuit has an input coupled to the third node and an output coupled to a fourth node. The second current source has a first terminal coupled to a fifth node and a second terminal coupled to the third node.

21 Claims, 8 Drawing Sheets

VOLTAGE SENSING CIRCUIT

CROSS-REFERENCE TO RELATED APPLICATIONS

The present application claims priority to Indian Provisional Patent Application No. 201841026010, which was filed Jul. 12, 2018, is titled "A nA $I_Q$, FAST RESPONSE VOLTAGE SENSING SCHEME WITH HIGH VOLTAGE PROTECTION CIRCUIT," and is hereby incorporated herein by reference in its entirety.

BACKGROUND

In various circuit implementations, it is advantageous to know whether a value of a signal (such as a supply voltage signal) is less than, or greater than, a value of a reference signal. For example, a supply voltage supervisor (SVS) circuit includes a voltage sensing circuit that monitors a supply voltage of another circuit (e.g., such as an embedded system, micro-controller, processor, etc.) for over-voltage and/or under-voltage conditions. In some examples, when a value of the supply voltage (or more generally, the signal being monitored) falls below a value of the reference signal, or rises above the value of the reference signal, the voltage sensing circuit outputs a signal indicating the crossing by the supply voltage of the reference signal. The output of the voltage sensing circuit, in some examples, is used by other components of the SVS circuit or any other suitable components, circuits, or devices, such as in generating a reset signal to prevent a component, circuit, or device receiving the supply voltage from being damaged due to over-voltage conditions or operating in an unexpected manner due to under-voltage conditions.

SUMMARY

Some aspects of the present disclosure provide for a circuit. In some examples, the circuit includes a Zener diode, a first current source, a first n-type field effect transistor (FET), a first inverter circuit, and a second current source. The Zener diode has a cathode coupled to a first node and an anode coupled to a second node. The first current source has a first terminal coupled to the second node and a second terminal coupled to a ground terminal. The first n-type FET has a gate terminal coupled to the second node, a source terminal coupled to the ground terminal, and a drain terminal coupled to a third node. The first inverter circuit has an input coupled to the third node and an output coupled to a fourth node. The second current source has a first terminal coupled to a fifth node and a second terminal coupled to the third node.

Other aspects of the present disclosure provide for a circuit. In some examples, the circuit includes a high-voltage protection circuit, a gate control circuit, a voltage divider circuit, a comparator, a hysteresis circuit, and a pulse generator circuit. The high-voltage protection circuit is coupled to an input voltage (Vin) terminal and configured to determine when a value of Vin exceeds a threshold voltage of the high-voltage protection circuit. The gate control circuit configured to generate a gate signal for controlling a gate terminal of a transistor based on a received first pulse signal. The voltage divider circuit coupled to the Vin terminal and the gate control circuit and configured to divide Vin to generate a divided Vin (DIV_IN) based on a capacitance ratio of the voltage divider circuit and reset DIV_IN based on a second pulse signal. The comparator coupled to the voltage divider circuit and configured to generate an output indicating whether DIV_IN exceeds a reference signal (Vref). The hysteresis circuit configured to generate and output a third control signal to control the voltage divider circuit based on a received control signal and the output of the comparator. The pulse generator circuit configured to generate the first pulse signal and the second pulse signal.

Other aspects of the present disclosure provide for a system. In some examples, the system includes a processing element and a supply voltage supervisor (SVS) circuit. The SVS circuit includes a voltage sensing circuit configured to detect an under-voltage condition, where the voltage sensing circuit includes a Zener diode, a first current source, a first n-type FET, a first inverter circuit, and a second current source. The Zener diode has a cathode coupled to a first node and an anode coupled to a second node. The first current source has a first terminal coupled to the second node and a second terminal coupled to a ground terminal. The first n-type FET has a gate terminal coupled to the second node, a source terminal coupled to the ground terminal, and a drain terminal coupled to a third node. The first inverter circuit has an input coupled to the third node and an output coupled to a fourth node. The second current source has a first terminal coupled to a fifth node and a second terminal coupled to the third node.

BRIEF DESCRIPTION OF THE DRAWINGS

For a detailed description of various examples, reference will now be made to the accompanying drawings in which.

DETAILED DESCRIPTION

In some examples, conflicting performance requirements can be placed on a voltage sensing circuit. For example, requirements for low current consumption (including low quiescent current draw) and fast performance may be in opposition to one another in many circuit topologies of voltage sensing circuits. Additionally, in some examples the value of the supply voltage may exceed safe limits of at least some components of the voltage sensing circuit. Accordingly, in at least some examples a more robust voltage sensing circuit protected against high voltage, having a low current draw, and having fast performance may be desirable.

At least some aspects of the present disclosure provide for a voltage sensing circuit protected against voltages exceeding safe limits of components of the voltage sensing circuit.

In some examples, the voltage sensing circuit further has a low current draw (e.g., less than about 60 nanoamps) and fast performance (e.g., time of receipt of a signal for sensing to output of a sensing result of less than about 20 microseconds). In some examples, the voltage sensing circuit includes one or more of a high voltage detection circuit, a gate control circuit, a capacitor divider circuit, a comparator, a hysteresis circuit, and a clock generator. The high voltage detection circuit, in some examples, detects an existence of a signal having a value greater than a predefined value and controls one or more components of the voltage sensing circuit to protect the one or more components of the voltage sensing circuit, or other components coupled to the one or more components of the voltage sensing circuit. The gate control circuit, in some examples, controls a switch (e.g., such as a transistor) of the capacitor divider circuit to control charging of capacitors of the capacitor divider circuit. The capacitor divider circuit, in some examples, scales a value of a received signal according to a capacitance ratio of the capacitor divider circuit.

Figure 1:
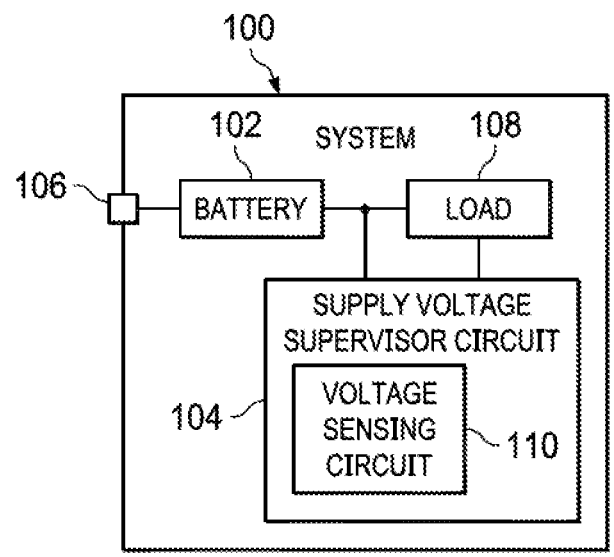
FIG. 1 shows a block diagram of an illustrative system in accordance with various examples.

Turning now to FIG. 1, a block diagram of an illustrative system 100 is shown. In at least some examples, the system 100 is representative of a consumer or other electronic device, such as a wearable device (e.g., a headset, earbuds, hearing aids, smart watches, fitness accessories, patient monitors, etc.), a smartphone, a laptop computer, a notebook or netbook computer, a tablet device, a power tool, or any other device that is powered by a battery and/or a mains voltage (e.g., via an adapter). In at least some examples, the battery is configured to be recharged within the system 100. In various examples, the system 100 includes a battery 102, a SVS circuit 104, an adapter port 106, and a load 108. The battery 102 is any suitable type of battery that is capable of providing power to components of the system 100, such as at least the load 108, and in some circumstances, the SVS circuit 104 and/or the adapter port 106 (e.g., such as in a circumstance in which power is provided from the battery 102 to a device (not shown) coupled to the adapter port 106 to charge and/or power the device coupled to the adapter port 106). In at least one example, the SVS circuit 104 monitors a value of a voltage provided to the load 108, whether provided by the battery 102, from the adapter port 106, or both. For example, the SVS circuit 104 monitors a value of a voltage signal (referred to from the perspective of the SVS circuit 104 as an input voltage (Vin) provided to the load 108 with respect to a reference voltage (Vref). For example, the SVS circuit 104 compares Vin (or a voltage derived from Vin) to Vref to determine whether Vin is greater than Vref and/or less than Vref, and in some examples, generate and provide a signal to reset the load 108 to prevent the load 108 from damage in over-voltage circumstances (e.g., when Vin is greater than Vref) or damage and/or unintended operation in under-voltage (e.g., brownout) circumstances (e.g., when Vin is less than Vref). In at least some examples, the SVS circuit 104 comprises a voltage sensing circuit 110. In an example, the SVS circuit 104 is a single chip housed inside a package. In another example, the SVS circuit 104 includes circuitry distributed across multiple chips, with all such chips housed inside a single package. In yet other examples, various packages housing chips are coupled together to create the functionality of the SVS circuit 104.

The SVS circuit 104 is coupled to the battery 102, the load 108, and the adapter port 106, to which a power supply (not shown) couples to provide power (e.g., mains power) to the system 100. For example, the adapter port 106 is suitable for connection by a user to mains power via an adapter (not shown) or to a device for powering the device, as discussed above. The load 108 is additionally coupled to the battery 102 and the adapter port 106. The system 100 is merely an example system in which the SVS circuit 104 can be implemented, and other implementations can include additional, or alternative components, such as power management components coupled between the adapter port 106 and other components of the system 100 and/or coupled between the battery 102 and other components of the system 100.

In at least one example of operation, the SVS circuit 104 monitors power provided by the adapter port 106 and/or the battery 102 to the load 108. In some examples, when Vin associated with that power exceeds Vref, such as determined by the voltage sensing circuit 110, the SVS circuit 104 generates and provides a reset signal to the load 108. In other examples, when Vin associated with that power falls below Vref, such as determined by the voltage sensing circuit 110, the SVS circuit 104 generates and provides a reset signal to the load 108. In yet other examples, the SVS circuit 104 includes a voltage sensing circuit 110 capable of determining both over-voltage and under-voltage conditions. In yet further examples, the SVS circuit 104 includes a plurality of voltage sensing circuits 110, where each voltage sensing circuit 110 compares Vin to some threshold or reference signal, including at least Vref. In at least some examples, the SVS circuit 104 and/or the voltage sensing circuit 110 receives one or more signals from the load 108 (e.g., clock signals, control signals, etc.) for use in voltage sensing, while in other examples the SVS circuit 104 and/or the voltage sensing circuit 110 receives one or more signals from another processing element (not shown) of the system 100.

In some examples, the voltage sensing circuit 110 implements techniques alluded to above and described in greater detail below to sense a value of Vin with respect to a value of Vref both with a rapid response (e.g., time of change of Vin to time of determination of value of Vin with respect to Vref) and minimal current consumption by the voltage sensing circuit 110 (e.g., making the voltage sensing circuit 110 suitable for implementation in at least some low-power applications). These techniques are, in some examples, helpful in extending a battery life of the battery 102 (e.g., an amount of time of use of the system 100 before the battery 102 discharges when operating without mains power received at the adapter port 106) and/or reducing a cost of operation of the system 100 by reducing power consumed by the system 100 in operations ancillary to those of the load 108.

Figure 2:
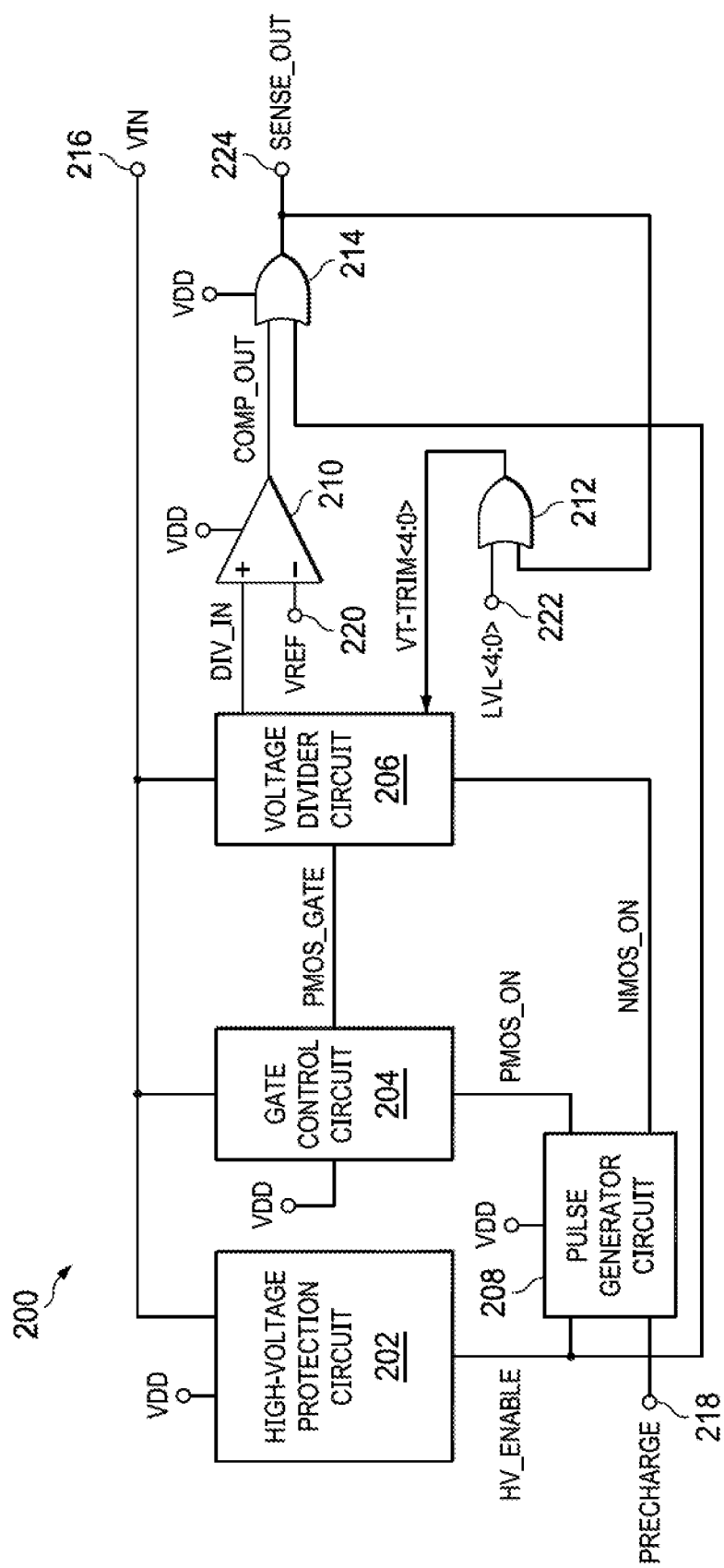
FIG. 2 shows a block diagram of an illustrative circuit in accordance with various examples.

Turning now to FIG. 2, a block diagram of an illustrative circuit 200 is shown. In at least some examples, the circuit 200 is suitable for implementation as the voltage sensing circuit 110 of FIG. 1. For example, the at least some implementations of the circuit 200 are suitable for comparing a value of Vin to a value of Vref and outputting a comparison result. In some further implementations, the circuit 200 provides protection against large values of Vin (e.g., high-voltage protection) that might otherwise damage one or more components of the circuit 200 in the absence of the high-voltage protection.

In at least one example, the circuit 200 includes a high-voltage protection circuit 202, a gate control circuit 204, a voltage divider circuit 206, a pulse generator circuit 208, a comparator 210, a hysteresis circuit 212, and a logic circuit 214. The high-voltage protection circuit 202 has a first input terminal coupled to a Vin terminal 216 and an output terminal coupled to a first input terminal of the pulse generator circuit 208 and a second input terminal of the logic circuit 214. The gate control circuit 204 has a first input terminal coupled to the Vin terminal 216, a second input terminal coupled to a first output terminal of the pulse generator circuit 208, and an output terminal coupled to a second input terminal of the voltage divider circuit 206. The voltage divider circuit 206 has a first input terminal coupled to the Vin terminal 216, a third input terminal coupled to a second output terminal of the pulse generator circuit 208, a fourth input terminal coupled to an output terminal of the hysteresis circuit 212, and an output terminal coupled to a first input terminal of the comparator 210. The pulse generator circuit 208 is coupled to a terminal 218 and configured to receive a clock signal (PRECHARGE) via the terminal 218. The comparator 210 is coupled at a second input terminal to a terminal 220 and configured to receive Vref at the terminal 220. The comparator 210 is further coupled at an output terminal to a first input terminal of the logic circuit 214. A first input terminal of the hysteresis circuit 212 is coupled to a terminal 222 and configured to receive a digital signal (LVL<4:0>) for at least partially controlling a voltage division ratio of the voltage divider circuit 206 and a second input terminal of the hysteresis circuit 212 is coupled to an output of the logic circuit 214. In some examples, the terminal 222 is representative of a plurality of terminals where each terminal receives one bit of LVL<4:0> in a parallel manner, while in other examples LVL<4:0> is received by a single terminal in a serial manner. An output terminal of the logic circuit 214 is coupled to a terminal 224 and configured to provide an output of the circuit 200 at the terminal 224. In at least some examples, each of the high-voltage protection circuit 202, the gate control circuit 204, the pulse generator circuit 208, the comparator 210, and/or the logic circuit 214 are configured to receive a supply voltage (Vdd) for operation of at least some components of the respective circuits, where Vdd is less than Vin. In at least some examples, Vdd is in a range of 2 volts (V) to 3.5 V.

In at least one example, the voltage divider circuit 206 includes a capacitor divider network (not shown). The capacitor divider network, in some examples, scales a received voltage based on a capacitance ratio of the capacitor divider network in a manner similar to a resistor voltage divider, where an output of the capacitor divider network is taken at a midpoint of the capacitor network. In at least some examples, a capacitor divider network improves over a resistor voltage divider by reducing current consumption while maintaining a smaller physical footprint and faster response time to a change in value of a received signal than a resistor voltage divider having a substantially similar current consumption to the capacitor divider network. Use of the capacitor divider network, in some examples, introduces challenges related to high-voltage protection of the capacitors of the capacitor divider network and capacitor leakage current, which are mitigated by the high-voltage protection circuit 202 and the pulse generator circuit 208, respectively, thereby providing a voltage sensing circuit having the robustness of a traditional resistive voltage divider-based sensing circuit while consuming less space, less current, and providing a faster response time than the traditional resistive voltage divider-based sensing circuit.

In an example of operation, the circuit 200 includes at least three operation stages. The three operations stages, in some examples, are a precharge stage, a hold stage, and a high-voltage stage. During the precharge stage, the pulse generator circuit 208 receives PRECHARGE. At a rising edge of PRECHARGE, the pulse generator circuit 208 generates a first pulse signal (PMOS_ON) and a second pulse signal (NMOS_ON), each having a duration of about 250 nanoseconds (ns). The first pulse signal is, in some examples, a negative pulse signal (e.g., such that the first pulse signal has a logical low value for the pulse duration and a logical high value otherwise) that is output via the first output terminal of the pulse generator circuit 208. The second pulse signal is, in some examples, a positive pulse signal (e.g., such that the second pulse signal has a logical high value for the pulse duration and a logical low value otherwise) that is output via the second output terminal of the pulse generator circuit 208. While described herein as being about 250 ns in duration, the first pulse signal and the second pulse signal may have any suitable duration as determined by a particular application environment of the circuit 200. In at least some examples, the second pulse signal has a duration less than 250 ns such that the second pulse signal has a first transition edge after a first transition edge of the first pulse signal and has a second transition edge before a second transition edge of the first pulse signal. Additionally, in various examples the pulse generator circuit 208 includes any circuitry and/or components suitable for generating pulse signals as discussed herein. For example, the pulse generator circuit 208 includes one or more logic circuits and/or one or more delay elements configured to generate the first pulse signal and the second pulse signal as discussed herein.

The gate control circuit 204 receives the first pulse signal and, based on the first pulse signal, controls a first switch (not shown) of the voltage divider circuit 206 to open and/or close. In at least some examples, the gate control circuit 204 includes a plurality of paths (not shown) such as a fast turn-off path, a fast turn-on path, and/or a weak hold-state path. During the precharge stage, the fast turn-off path of the gate control circuit 204 is activated at the rising edge of the first pulse signal, generating an output (PMOS_GATE) of the gate control circuit that is pulled up toward Vin with an amount of current in a microamp range. PMOS_GATE, when pulled up toward Vin and in at least some examples, controls the first switch of the voltage divider circuit 206 to rapidly turn off, opening and electrically decoupling at least a portion of the voltage divider circuit 206 from Vin. At the falling edge of the first pulse signal, the fast turn-off path is deactivated and the fast turn-on path is activated, pulling PMOS_GATE rapidly toward a ground potential (e.g., or other signal value present at a ground terminal (not shown) of the circuit 200) with an amount of current in a nanoamp range. PMOS_GATE, when pulled down toward the ground potential and in at least some examples, controls the first switch of the voltage divider circuit 206 to rapidly turn on, closing and electrically coupling at least the portion of the voltage divider circuit 206 to Vin. The first switch of the voltage divider circuit 206 is, in some examples, a transistor such as a p-type field effect transistor (FET) (pFET), and in some examples is a drain-extended pFET.

The voltage divider circuit 206 receives the second pulse signal and, based on the second pulse signal, controls a plurality of switches of the voltage divider circuit 206 to open and/or close. For example, during the precharge stage, a second switch (not shown) and a third switch (not shown) of the voltage divider circuit 206 are controlled to close substantially concurrently with a rising edge of the second pulse signal and open substantially concurrently with a falling edge of the second pulse signal. In at least some examples, closing the second switch and the third switch discharges a first node and a second node, respectively, of the voltage divider circuit 206 to the ground potential. In at least some examples, discharging the first node and the second node resets the voltage divider network when the voltage divider network is a capacitor divider network, as discussed above, compensating for leakage current of the capacitor divider network to maintain accuracy of the capacitor divider network. In at least some examples, opening the second switch and the third switch, when the first is also closed, causes the voltage divider circuit 206 to return to normal operation, where a signal present at the first node is representative of a signal prior to division by the voltage divider circuit 206 and a signal present at the second node is representative of the signal after division by the voltage divider circuit 206.

Turning now to the hold stage, PMOS_GATE is maintained at a logical low value via the weak hold-state path in which a current comparator holds PMOS_GATE at the logical low value (e.g., such as by a current source sourcing current to a node at which PMOS_GATE is present and a current sink sinking current from the node at which PMOS_GATE is present, where the current sink sinks a greater amount of current than the current source sources). In at least some examples, the weak hold-state path reduces current consumption of the gate control circuit 204 by minimizing current usage (e.g., in a nanoamp range) to maintain PMOS_GATE at a value as compared to the microamp range current consumed in the fast turn-on and/or fast turn-off paths of the gate control circuit 204.

In at least some examples, a division ratio of the voltage divider circuit 206 is determined according to a trim signal (VT_TRIM<4:0>) received from the hysteresis circuit 212. For example, based on VT_TRIM<4:0>, one or more elements are electrically coupled into the voltage divider circuit 206 between the second node and a ground terminal that is configured to couple to the ground potential. For example, a first bit of VT_TRIM<4:0> is configured to control a fourth switch, a second bit of VT_TRIM<4:0> is configured to control a fifth switch, etc., where for each bit of VT_TRIM<4:0>, an additional element is electrically coupled into the voltage divider circuit 206 between the second node and the ground terminal. In this way, division ratio of the voltage divider circuit 206 is programmable.

A signal present at the second node of the voltage divider circuit 206 (DIV_IN) is compared by the comparator 210 to Vref. When DIV_IN is greater than Vref, the comparator 210 outputs an output signal (COMP_OUT) having a logical high value and when DIV_IN is less than Vref, the comparator 210 outputs COMP_OUT having a logical low value. In at least some examples, the resetting of the voltage divider circuit 206, as discussed above, causes DIV_IN to reduce to approximately the ground potential for approximately the same duration of time as the first pulse and/or the second pulse. This momentary drop may be referred to as a glitch in DIV_IN. In some examples, the glitch in DIV_IN would be reflected in COMP_OUT. However, in at least some examples the comparator 210 includes glitch immunity (e.g., via a glitch filter) that mitigates translation of the glitch in DIV_IN to COMP_OUT such that COMP_OUT is unaffected by the precharging of the voltage divider circuit 206 performed during the precharge stage.

In at least some examples, SENSE_OUT is provided at the second input terminal of the hysteresis circuit 212. Generally, the hysteresis circuit 212 controls the voltage divider circuit 206 to modify the division ratio based on VT_TRIM<4:0>, as discussed above, which is based at least partially on the received value LVL<4:0>. In at least some examples, VT_TRIM<4:0> is further determined according to SENSE_OUT. For example, when COMP_OUT and correspondingly SENSE_OUT change in value, DIV_IN and Vref can be very near in value either momentarily or for an extended period of time if Vin, and therefore DIV_IN, are slow-changing. The nearness in value of DIV_IN and Vref creates a circumstance in which signal noise present in DIV_IN, Vref, or both can create a ringing effect, causing COMP_OUT and correspondingly SENSE_OUT to alternate between logical high and logical low values as the signal noise causes DIV_IN to be greater than or less than Vref alternatingly in short periods of time. This ringing effect is undesirable, in some examples causing inaccuracy in COMP_OUT and correspondingly SENSE_OUT and propagating to inaccuracy in a device that receives, uses, or otherwise relies on SENSE_OUT in operational decision-making. To mitigate the possibility of COMP_OUT and correspondingly SENSE_OUT ringing due to signal noise in DIV_IN or Vref, the hysteresis circuit 212 generates VT_TRIM<4:0> at least partially according to SENSE_OUT such that when SENSE_OUT transitions from a logical low value to a logical high value, the logical high value is added to LVL<4:0> to cause a non-linear increase in DIV_IN and when SENSE_OUT transitions from a logical high value to a logical low value, the logical low value is subtracted from LVL<4:0> to cause a non-linear decrease in DIV_IN, creating a hysteresis effect in DIV_IN that mitigates effects of noise in DIV_IN or Vref from affecting COMP_OUT and correspondingly SENSE_OUT.

Turning now to the high-voltage stage, when Vin exceeds a threshold voltage of the high-voltage protection circuit 202, the high-voltage protection circuit 202 generates and outputs a signal (HV_ENABLE) indicating that Vin has exceeded the threshold voltage. In at least some examples, the threshold is a forward conduction threshold of a diode (not shown). In various examples the diode is a Zener diode, a p-n diode, or any other suitable diode type or process technology. In some examples, a single diode establishes the threshold voltage, while in other examples the threshold voltage is established by a plurality of diodes coupled in series and/or parallel or one or more transistors coupled in a diode configuration.

When HV_ENABLE has a logical high value, in at least some examples, the pulse generator circuit 208 outputs the first pulse signal and the second pulse signal in substantially the same manner as above, with the exception that the first pulse signal and the second pulse signal maintain their pulse values for a duration of receipt of HV_ENABLE having a logical high value by the pulse generator circuit 208. For example, the pulse generator circuit 208 outputs the first pulse signal as a constant logical low value while HV_ENABLE has the logical high value and outputs the second pulse signal as a logical high value while HV_ENABLE has the logical high value. When HV_ENABLE transitions to a logical low value, the pulse generator circuit 208 returns to normal operation, the value of the first pulse signal transitioning from the logical low level to a logical high level and the value of the second pulse signal transitioning from the logical high level until the logical low level, both until receipt of a next rising edge of PRECHARGE or until subsequent receipt of HV_ENABLE having a logical high value, whichever is received first by the pulse generator circuit 208. While HV_ENABLE has the logical high value and the first pulse signal and the second pulse signal are each held at the same value discussed above with respect to the pulse duration, the gate control circuit 204 and the voltage divider circuit 206 each operate substantially the same as discussed above with respect to the precharge stage.

Additionally, in at least some examples, in both the hold stage and the high-voltage stage, COMP_OUT is gated by the logic circuit 214. For example, the logic circuit 214 gating COMP_OUT generates an output value of the logic circuit 214 (SENSE_OUT) determined according to COMP_OUT and/or HV_ENABLE. For example, in some implementations the logic circuit 214 is implemented as a digital and/or analog circuit having logical OR functionality (e.g., such as a digital logic OR gate). In such an implementation, when HV_ENABLE has a logical low value, a value of SENSE_OUT tracks a value of COMP_OUT. However, when HV_ENABLE is a logical high value, the voltage divider network 206 is discharged, causing a change to COMP_OUT for a period of time approximately equal to an amount of time that the value of Vin exceeds the threshold of the high voltage protection circuit 202. In at least some examples, this change to COMP_OUT (e.g., indicating that Vin is less than Vref according to the circuit 200 while in reality Vin is much greater than Vref) can result in unintended operations of a component, circuit, or other device receiving Vin and at least partially depending on the accuracy of an output of the circuit 200. To mitigate against this change in COMP_OUT, when HV_ENABLE is a logical high value, regardless of a value of COMP_OUT, SENSE_OUT tracks the value of HV_ENABLE and remains at the logical high value.

Figure 3:
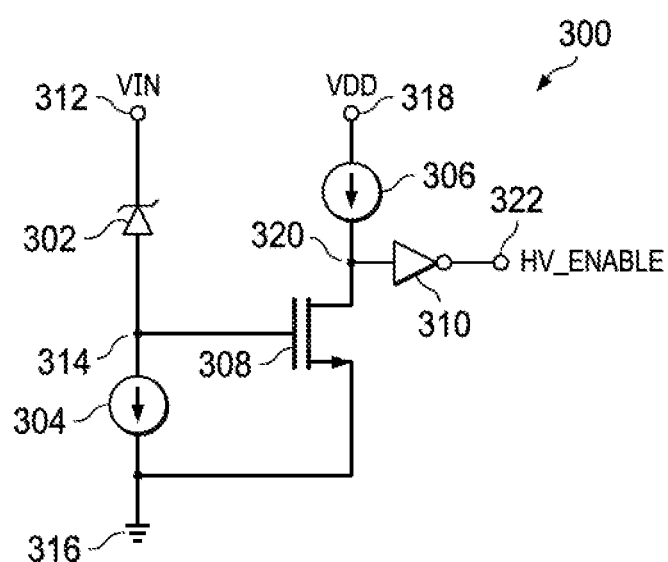
FIG. 3 shows a schematic diagram of an illustrative circuit in accordance with various examples.

Turning now to FIG. 3, a schematic diagram of an illustrative circuit 300 is shown. In at least some examples, the circuit 300 is suitable for implementation as the high-voltage protection circuit 202 of FIG. 2. In other examples, the circuit 300 is suitable for implementation in any architecture in which rapid detection of a high-voltage input signal (e.g., high-voltage as determined by a threshold value of one or more components of the circuit 300) while drawing a minimal and/or small quiescent current is desired. In some examples, the circuit 300 includes a diode 302, a current source 304, a current source 306, a switch 308, and an inverter circuit 310. While illustrated as a diode, in various examples the diode 302 is merely representative of a component or components having some threshold voltage that is exceeded prior to the component(s) beginning conducting. For example, the diode 302 may be representative of one or more diodes coupled in series and/or parallel configurations to reach a desired threshold voltage, one or more Zener diodes coupled in series and/or parallel configurations to reach the desired threshold voltage, one or more FET or other transistor devices configured in a diode arrangement and coupled in series and/or parallel configurations to reach the desired threshold voltage, or any other suitable component capable of providing this functionality.

In at least one architecture of the circuit 300, the diode 302 has a cathode coupled to a node 312 and an anode coupled to a node 314. The current source 304 is coupled to the node 314 and configured to sink current from the node 314 to a ground terminal 316, where the ground terminal 316 is configured to couple to a ground voltage potential. The current source 306 is coupled to a node 318 and a node 320 and configured to sink current from the node 318 to the node 320. The switch 308 has a first terminal coupled to the node 320, a second terminal coupled to the ground terminal 316, and a control terminal coupled to the node 314. In at least some examples, the switch 308 is a transistor, such as a n-type FET, having a gate terminal coupled to the node 314, a drain terminal coupled to the node 320, and a source terminal coupled to the ground terminal 316. The inverter circuit 310 has an input coupled to the node 320 and an output coupled to a node 322. The node 312, in some examples, is configured to receive an input signal for comparison to the threshold established by the diode 302. In at least some examples, Vin is received at the node 312. The node 318, in some examples, is configured to receive Vdd for operating the circuit 300. The node 322, in at least some examples, is configured to provide an output of the circuit 300, for example, indicating that Vin is greater than the threshold established by the diode 302 or less than the threshold established by the diode 302. In at least some examples, the node 322 is configured to provide HV_ENABLE.

In an example of operation of the circuit 300, the diode 302 has a threshold voltage (Vth) below which the diode does not conduct between the node 312 and the node 314 and above which the diode 302 does conduct between the node 312 and the node 314. When Vin is less than Vth, in at least some examples, the circuit 300 consumes approximately zero current, making the circuit 300 advantageous for use in a system in which a minimal and/or reduced current draw (such as quiescent current draw) is desired. When Vin exceeds Vth, the diode 302 begins conducting between the node 312 and the node 314, causing a voltage approximately equal to Vin minus Vth to be present at the node 314. When the voltage present at the node 314 is greater than a threshold for turning-on the switch 308 (e.g., such as a gate-to-source voltage (Vgs) when the switch 308 is a n-type FET), the switch 308 turns on, electrically coupling the node 320 to the ground terminal 316, creating a voltage present at the node 320 approximately equal to 0V, equating to a logical low signal. The inverter circuit 310 inverts the voltage present at the node 320 to create a logical high signal at the node 322 (e.g., having a voltage approximately equal to a value of a supply voltage of the inverter circuit 310, which in at least some examples is Vdd). The logical high signal present at node 322 indicates that a high voltage signal has been detected at the node 312.

When Vin becomes less than Vth, the diode 302 stops conducting between the node 312 and the node 314 and the current source 304 pulls the node 314 down to a value present at the ground terminal 316 (e.g., by sinking current from the node 314), discharging the node 314 until the threshold for turning-on the switch 308 is no longer present at the node 314 and the switch 308 turns off, at which point the current source 304 also ceases operation. When the switch 308 turns off, the node 320 is electrically decoupled from the ground terminal 316 and a voltage present at the node 320 is pulled up by the current source 306 to have a value approximately equal to Vdd, equating to a logical high signal. The inverter circuit 310 inverts the voltage present at the node 320 to create a logical low signal at the node 322. The logical low signal present at node 322 indicates that a high voltage signal has not been detected at the node 312.

Figure 4:
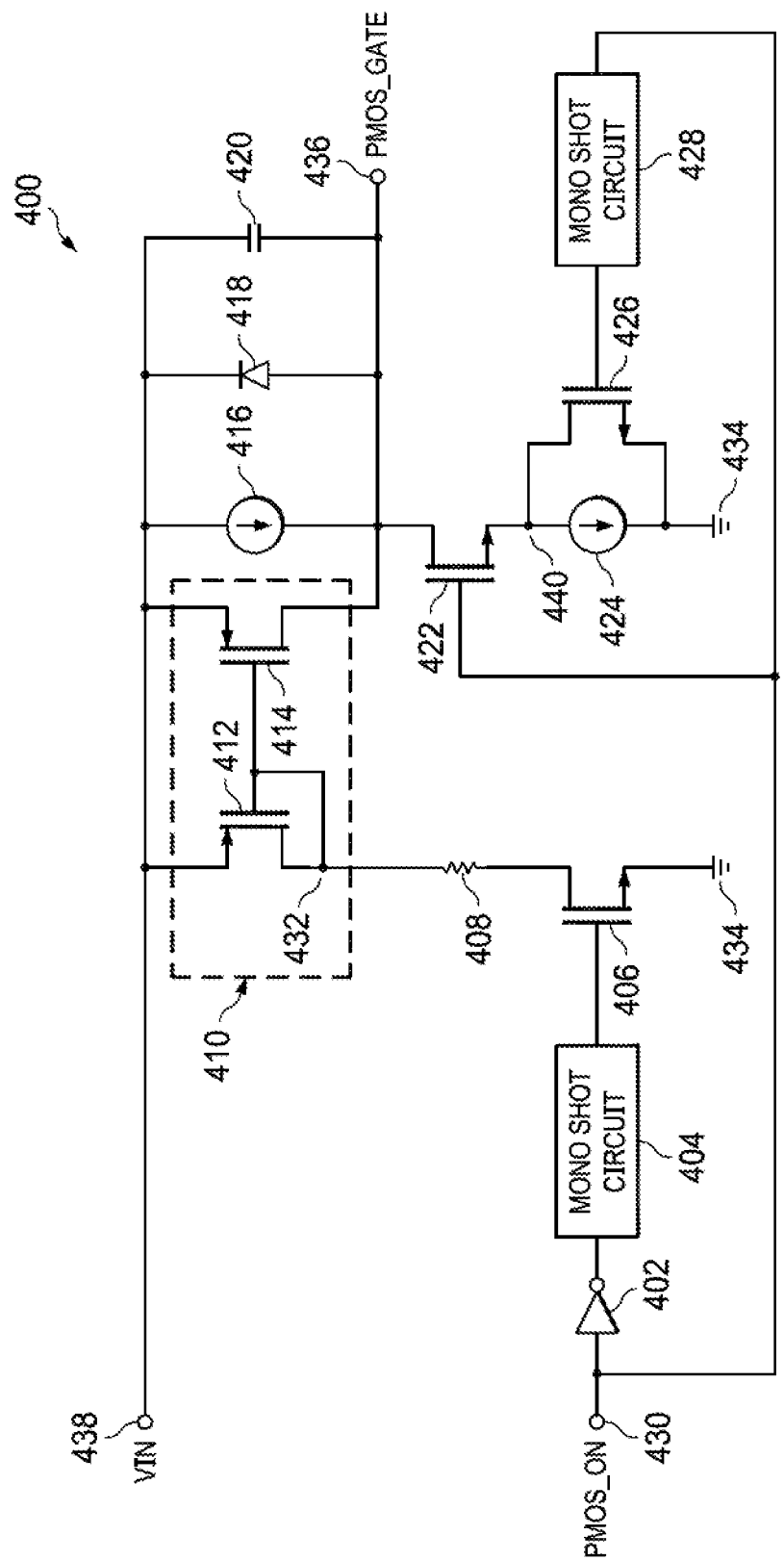
FIG. 4 shows a schematic diagram of an illustrative circuit in accordance with various examples.

Turning now to FIG. 4, a schematic diagram of an illustrative circuit 400 is shown. In at least some examples, the circuit 400 is suitable for implementation as the gate control circuit 204 of FIG. 2. In other examples, the circuit 400 is suitable for implementation in any architecture in which rapid control of a transistor while drawing a minimal and/or small quiescent current or steady-state current is desired. In some examples, the circuit 400 includes an inverter circuit 402, a mono shot circuit 404, a transistor 406, a resistor 408, a current mirror 410 formed by a transistor 412 and a transistor 414, a current source 416, a diode 418, a capacitor 420, a transistor 422, a current source 424, a transistor 426, and a mono shot circuit 428.

In at least one architecture of the circuit 400, the inverter circuit 402 has an input coupled to a node 430 and an output coupled to an input of the mono shot circuit 404, which has an output coupled to a gate terminal of the transistor 406. The transistor 406 has a drain terminal coupled through the resistor 408 to a node 432 and a source terminal coupled to a ground terminal 434, which is configured to couple to a ground voltage potential. The current mirror 410 is configured to mirror a current from the node 432 to a node 436. For example, the transistor 412 has a gate terminal and a drain terminal coupled to the node 432 and a source terminal coupled to a node 438 and the transistor 414 has a gate terminal coupled to the node 432, a drain terminal coupled to the node 436, and a source terminal coupled to the node 438. The current source 416 is coupled between the node 438 and the node 436 and configured to source current to the node 436. The diode 418 has a cathode coupled to the node 438 and an anode coupled to the node 436. The capacitor 420 has a first terminal coupled to the node 438 and a second terminal coupled to the node 436. The transistor 422 has a gate terminal coupled to the node 430, a drain terminal coupled to the node 436, and a source terminal coupled to a node 440. The current source 424 is coupled between the node 440 and the ground terminal 434 and is configured to sink current from the node 440 to the ground terminal 434. The transistor 426 has a gate terminal coupled to an output of the mono shot circuit 428, a drain terminal coupled to the node 440, and a source terminal coupled to the ground terminal 434. The mono shot circuit 428 has an input coupled to the node 430. The node 430, in some examples, is configured to command signal for use in controlling a transistor. In at least some examples, the node 430 is configured to receive PMOS_ON. The node 436, in some examples, is configured to provide an output of the circuit 400. In at least some examples, the node 436 is configured to provide PMOS_GATE. In at least some examples, Vin is received at the node 438. The transistor 406, transistor 422, and transistor 426, in at least some examples, are n-type FET transistors. The transistor 412 and the transistor 414, in at least some examples, are p-type FET transistors. The mono shot circuit 404 and the mono shot circuit 428, in some examples, are each mono-stable or one-shot multi-vibrators configured to output a pulse of a specified width (e.g., specified period of time, such as about 20 ns) in response to a rising edge of a received signal. In at least some examples, the mono shot circuit 404 and the mono shot circuit 428 are each referred to as pulse generators.

In an example of operation of the circuit 400, a signal is received at the node 430. The inverter circuit 402 inverts the signal received at the node 430 to generate a logical high signal when the signal received at the node 430 has a logical low value or generates a logical low signal when the signal received at the node 430 has a logical high value. Based on the output of the inverter circuit 402 changing from a logical low value to a logical high value, the mono shot circuit 404 generates a pulse signal. The pulse signal, in at least some examples, has a logical high value for a predefined period of time before transitioning to a logical low value. When the pulse signal has the logical high value, in at least some examples the transistor 406 turns on, conducting between its source and drain terminals and electrically coupling the node 432 to the ground terminal 434 through the resistor 408 and the transistor 406 and correspondingly causing the transistor 412 and the transistor 414 of the current mirror 410 to turn on and begin conducting between their respective source terminals. In at least one example, an amount of current flowing through the node 432 is mirrored to the node 436. The amount of current flowing through the node 436, in at least some examples, is determined according to a value of a voltage present at the node 438 divided by a resistance of the resistor 408. In at least some examples, PMOS_GATE has a logical high value while current is being mirrored from the node 432 to the node 436, which when PMOS_GATE is used to control a p-type FET, causes the p-type FET to turn off. Because of the comparatively high current of PMOS_GATE when current is being mirrored from the node 432 to the node 436 a p-type FET controlled by PMOS_GATE will turn off rapidly. At the expiration of the duration of the pulse signal, in at least some examples, the transistor 406 turns off such that current no longer flows through the resistor 408 or is mirrored from the node 432 to the node 436 by the current mirror 410. When the signal received at the node 430 has the logical low value, in at least some examples, the transistor 422 is maintained in a non-conductive state (e.g., turned-off). The capacitor 420 compensates in the circuit 400 for rapid transitions in a value of a voltage present at the node 436. For example, when Vin is present at node 436 and a value of Vin rises rapidly, the capacitor 420 pulls the node 436 up, tracking Vin. In at least some examples, the inclusion of the capacitor 420 is advantageous to compensate for otherwise slow tracking of the node 436 with Vin when the value of Vin rises rapidly because of a weak nature of the current source 416 that would result in slow tracking of the node 436 with Vin in the absence of the capacitor 420.

When the signal received at node 430 transitions from the logical low value to a logical high value, the mono shot circuit 428 generates a second pulse signal. The second pulse signal, in at least some examples, has a logical high value for a predefined period of time before transitioning to a logical low value. When the second pulse signal has the logical high value, in at least some examples the transistor 426 turns on, conducting between its source and drain terminals and electrically coupling the node 440 to the ground terminal 434 discharging the node 440 to the ground terminal 434. At the expiration of the duration of the second pulse signal, in at least some examples, the transistor 426 turns off such that the node 440 is electrically decoupled from the ground terminal 434. Also when the signal received at the node 430 has the logical high value, the transistor 422 turns on, electrically coupling the node 436 to the node 440. When the transistor 422 and the transistor 426 are both turned on, the node 436 is discharged to the ground terminal 434, rapidly bringing PMOS_GATE from a logical high value to a logical low value and turning on a p-type FET controlled by PMOS_GATE.

When the transistor 422 is turned on and the transistor 426 is turned off, the node 436 is held at the logical low value via a current comparator formed by the current source 416 and the current source 424, where the current source 424 sinks a greater amount of current from the node 436 than the current source 416 sources to the node 436. For example, in at least one architecture of the circuit 400, the current source 416 sources about 2 nanoamps of current to the node 436 and the current source 424 sinks about 12 nanoamps of current from the node 436. In at least some examples, initially mirroring the current from the node 432 to the node 436 for output as a transistor control signal has an advantage of creating a strong control signal (e.g., having a current in a microamp range) that will rapidly turn off a p-type FET transistor having a gate terminal that receives the control signal (e.g., PMOS_GATE) while having a disadvantage of comparatively high current draw and power consumption. By ceasing to mirror the comparatively high current from the node 432 to the node 436 after a sufficient period of time to turn off a transistor controlled by PMOS_GATE, and thereafter generating PMOS gate using the current source 416 and the current source 424, the circuit 400 has the advantage of reducing current draw while maintaining PMOS_GATE at the logical low level by multiple orders of magnitude (e.g., in a nanoamp range) when compared to the comparatively high microamp range current draw of the circuit 400 when the current at the node 432 is being mirrored to the node 436. In at least some examples, the diode 418 protects a PMOS device (not shown) coupled to the node 436 when the node 436 is held at the logical low level by preventing the node 436 from being pulled fully down to a ground potential.

Figure 5:
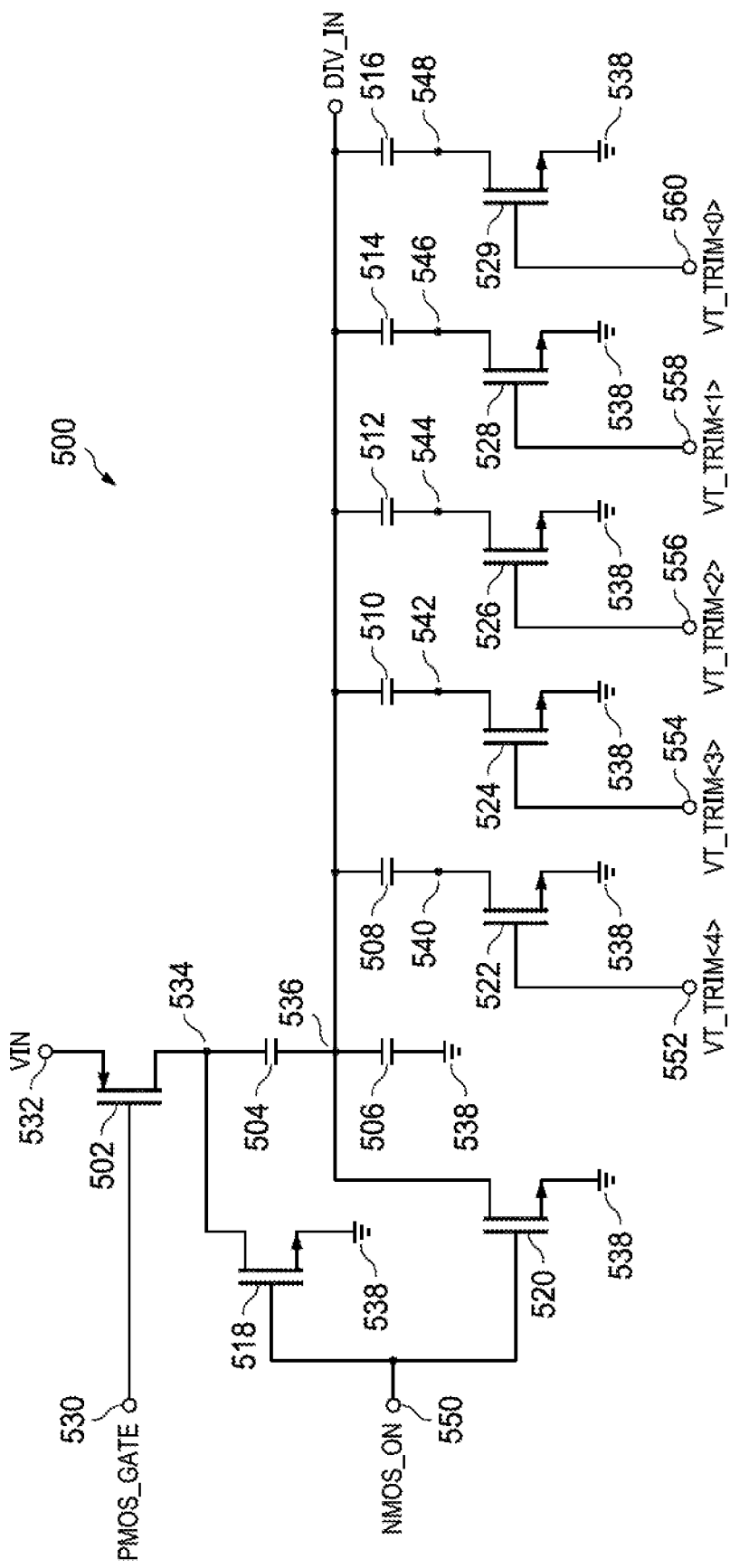
FIG. 5 shows a schematic diagram of an illustrative circuit in accordance with various examples.

Turning now to FIG. 5, a schematic diagram of an illustrative circuit 500 is shown. In at least some examples, the circuit 500 is suitable for implementation as the voltage divider circuit 206 of FIG. 2. In other examples, the circuit 500 is suitable for implementation in any architecture in which voltage division with a minimal current draw, fast transient response time, and minimal physical are footprint is desired. In some examples, the circuit 500 includes a transistor 502, a capacitor 504, a capacitor 506, a capacitor 508, a capacitor 510, a capacitor 512, a capacitor 514, a capacitor 516, a transistor 518, a transistor 520, a transistor 522, a transistor 524, a transistor 526, and a transistor 528, and a transistor 529. In at least some examples, the transistor 502 is a p-type FET and the transistor 518, the transistor 520, the transistor 522, the transistor 524, the transistor 526, the transistor 528, and the transistor 529 are each n-type FETs. Additionally, in some examples the transistor 502 is a drain-extended p-type FET. In some examples, the capacitor 504, the capacitor 506, the capacitor 508, the capacitor 510, the capacitor 512, the capacitor 514, and/or the capacitor 516 is representative of any combination of one or more capacitors or other capacitive elements coupled in series and/or parallel to form a desired amount of capacitance.

In at least one architecture of the circuit 500, the transistor has a gate terminal coupled to a node 530, a source terminal coupled to a node 532, and a drain terminal coupled to a node 534. The capacitor 504 has a first terminal coupled to the node 534 and a second terminal coupled to the node 536. The capacitor 506 has a first terminal coupled to the node 536 and a second terminal coupled to a ground terminal 538, which is configured to couple to a ground voltage potential. The capacitor 508 has a first terminal coupled to the node 536 and a second terminal coupled to a node 540. The capacitor 510 has a first terminal coupled to the node 536 and a second terminal coupled to a node 542. The capacitor 512 has a first terminal coupled to the node 536 and a second terminal coupled to a node 544. The capacitor 514 has a first terminal coupled to the node 536 and a second terminal coupled to a node 546. The capacitor 516 has a first terminal coupled to the node 536 and a second terminal coupled to a node 548. The transistor 518 has a gate terminal coupled to a node 550, a drain terminal coupled to the node 534, and a source terminal coupled to the ground terminal 538. The transistor 520 has a gate terminal coupled to the node 550, a drain terminal coupled to the node 536, and a source terminal coupled to the ground terminal 538. The transistor 522 has a gate terminal coupled to a node 552, a drain terminal coupled to the node 540, and a source terminal coupled to the ground terminal 538. The transistor 524 has a gate terminal coupled to a node 554, a drain terminal coupled to the node 542, and a source terminal coupled to the ground terminal 538. The transistor 526 has a gate terminal coupled to a node 556, a drain terminal coupled to the node 544, and a source terminal coupled to the ground terminal 538. The transistor 528 has a gate terminal coupled to a node 558, a drain terminal coupled to the node 546, and a source terminal coupled to the ground terminal 538. The transistor 529 has a gate terminal coupled to a node 560, a drain terminal coupled to the node 548, and a source terminal coupled to the ground terminal 538.

In at least some examples, PMOS_GATE is received at the node 530, Vin is received at the node 532, and NMOS_ON is received at the node 550. The node 536, in some examples, is configured to provide an output of the circuit 500. In at least some examples, the node 536 is configured to provide DIV_IN. In at least some examples, the node 552 is configured to receive a control signal VT_TRIM <4>, the node 554 is configured to receive a control signal VT_TRIM <3>, the node 556 is configured to receive a control signal VT_TRIM <2>, the node 558 is configured to receive a control signal VT_TRIM <1>, and the node 560 is configured to receive a control signal VT_TRIM <0>.

In an example of operation of the circuit 500, Vin is divided to form DIV_IN, for example, by multiplying by a ratio of capacitance in the circuit 500. For example, when Vin is X, a capacitance of the capacitor 504 has a magnitude of Y, and a sum of the capacitances of the capacitor 506, the capacitor 508, the capacitor 510, the capacitor 512, the capacitor 514, and the capacitor 516, depending on which of the capacitor 506, the capacitor 508, the capacitor 510, the capacitor 512, the capacitor 514, or the capacitor 516 are active in the circuit 500 at a given time has a magnitude of Z, DIV_IN is approximately equal to Vin*Y/(Z+Y), assuming that an amount of charge held by each of the capacitor 504, the capacitor 506, the capacitor 508, the capacitor 510, the capacitor 512, the capacitor 514, and the capacitor 516 is the same.

When PMOS_GATE has a logical low value, the transistor 502 is turned-on and conducts between the node 532 and the node 534, providing Vin from the node 532 to the node 534. The signal present at the node 534 is divided by a capacitor divider formed of the capacitor 504, the capacitor 506, the capacitor 508, the capacitor 510, the capacitor 512, the capacitor 514, and the capacitor 516, depending on which of the capacitor 506, the capacitor 508, the capacitor 510, the capacitor 512, the capacitor 514, or the capacitor 516 are active in the circuit 500 at a given time, to generate DIV_IN at the node 536.

When PMOS_GATE has a logical high value, the transistor 502 is turned-off and ceases conducting between the node 532 and the node 534. In at least some examples, despite the transistor 502 no longer conducting between the node 532 and the node 534, when NMOS_ON has a logical low value, charge present at the node 534 and the node 536 remains stored since no path exists for discharging the stored charge. When NMOS_ON has a logical high value, the transistor 518 conducts between the node 534 and the ground terminal 538, discharging the node 534 to the ground terminal 538. Additionally, when NMOS_ON has the logical high value, the transistor 520 conducts between the node 536 and the ground terminal 538, discharging the node 536 to the ground terminal 538.

In at least some examples, the transistor 522, the transistor 524, the transistor 526, the transistor 528, and the transistor 529 are configured to electrically couple the capacitor 508, the capacitor 510, the capacitor 512, the capacitor 514, and the capacitor 516, respectively, into the circuit 500 based on VT_TRIM<4:0>. For example, when VT_TRIM<4> has a logical high value, the transistor 522 electrically couples the capacitor 508 in parallel with the capacitor 506 and when VT_TRIM<4> has a logical low value, the transistor 522 electrically decouples the capacitor 508 from the circuit 500. Similarly, when VT_TRIM<3> has a logical high value, the transistor 524 electrically couples the capacitor 510 in parallel with the capacitor 506 and when VT_TRIM<3> has a logical low value, the transistor 524 electrically decouples the capacitor 510 from the circuit 500. The transistor 526 and capacitor 512 based on VT_TRIM<2>, the transistor 528 and capacitor 514 based on VT_TRIM<1>, and the transistor 529 and capacitor 516 based on VT_TRIM<0> operate in substantially the same manner as above. By controlling the amount of capacitance in the circuit 500 based on VT_TRIM<4:0>, in at least some examples the circuit 500 has an advantage of programmability and the ability to program the circuit 500 for hysteresis, as further described elsewhere herein.

In at least some examples, the circuit 500 is advantageous when compared to other voltage divider circuit architectures in multiple manners. For example, the circuit 500 consumes less current (e.g., in a nanoamp range) than a comparative resistance-based divider (e.g., in a microamp range) with a similar propagation delay (e.g., less than about 20 microseconds) from a change to Vin presenting at the node 532 to a corresponding change to DIV_IN settling in value at the node 536 and consumes approximately less than half of a physical footprint (e.g., surface area) than the comparative resistance-based divider. In some examples, the circuit 500 also introduces additional challenges not present in the comparative resistance-based divider. For example, capacitors can experience leakage current which can lead to inaccuracy in an output of a capacitance-based divider. To compensate for the occurrence of leakage current and the inaccuracy in the output of the capacitance-based divider, in a least some examples the transistor 502, the transistor 518, and the transistor 520 enable resetting (e.g., such as discharging) of the circuit 500, for example, based on PMOS_GATE and NMOS_ON, which are at least partially based on PRECHARGE.

Figure 6:
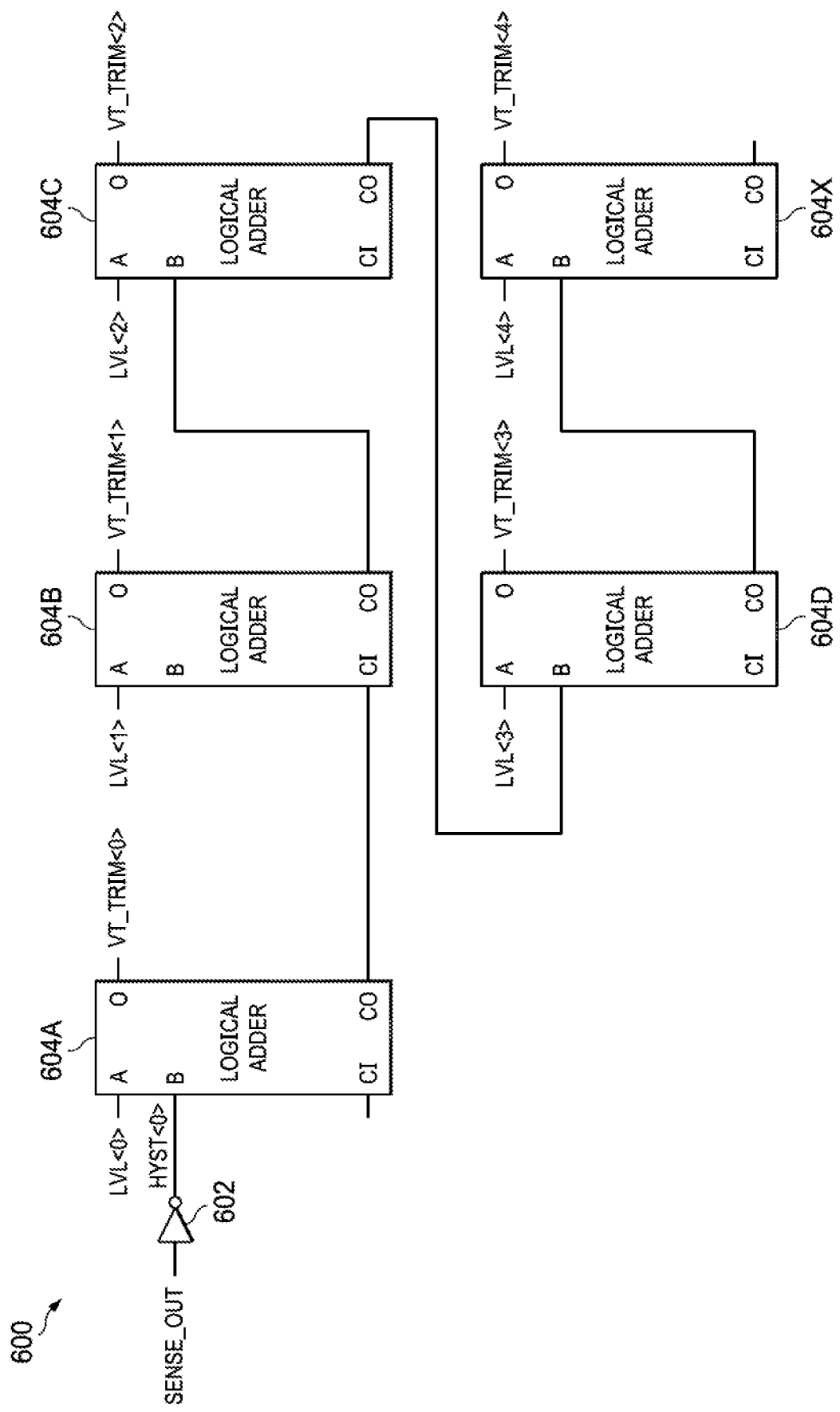
FIG. 6 shows a schematic diagram of an illustrative circuit in accordance with various examples.
Figure 7:
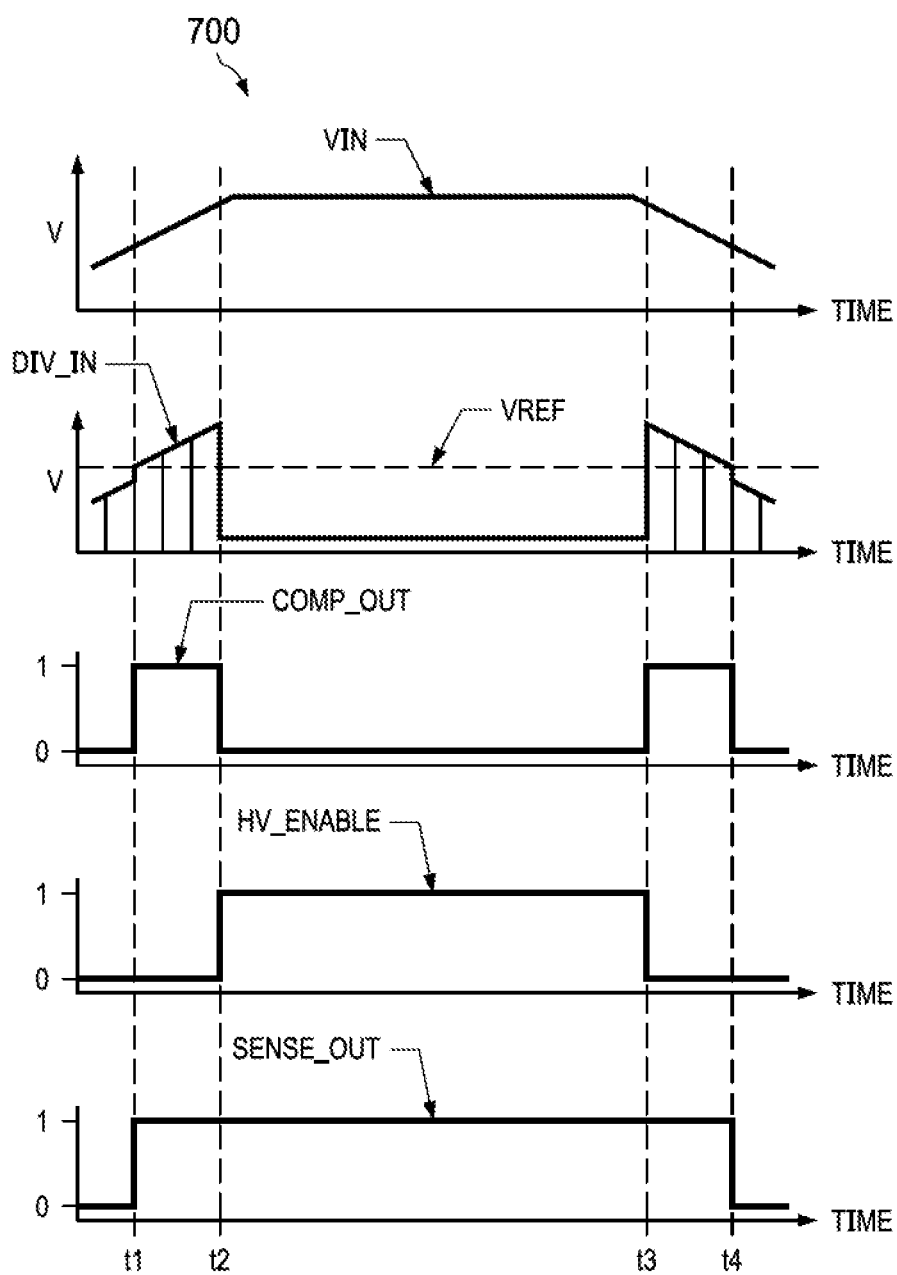
FIG. 7 shows a diagram of illustrative signals in accordance with various examples.

Turning now to FIG. 6, a schematic diagram of an illustrative circuit 600 is shown. In at least some examples, the circuit 600 is suitable for implementation as the hysteresis circuit 212 of FIG. 2. The circuit 600 includes, in at least some examples, an inverter circuit 602, and a plurality of logical adders 604A, 604B, 604C, 604D, . . . 604X. In at least some examples, the inverter circuit 602 has an input configured to receive SENSE_OUT and is configured to output HYST<0>. The logical adder 604A has a first input configured to receive LVL<0>, a second input coupled to the output of the inverter circuit 602 and configured to receive HYST<0>, a carry input configured to receive a logical low signal from any suitable source, an output configured to output VT_TRIM<0>, and a carry output. In at least some examples, a carry input of the logical adder 604A is configured to receive a logical low value signal. The logical adder 604B has a first input configured to receive LVL<1>, a carry input coupled to the carry output of the logical adder 604A, an output configured to output LVL<1>, and a carry output. The logical adder 604C has a first input configured to receive LVL<2>, a second input coupled to the carry output of the logical adder 604B, an output configured to output VT_TRIM<2>, and a carry output. The logical adder 604D has a first input configured to receive LVL<3>, a second input coupled to the carry output of the logical adder 604C, an output configured to output VT_TRIM<3>, and a carry output. The logical adder 604X has a first input configured to receive LVL<4>, a second input coupled to the carry output of the logical adder 604C, an output configured to output VT_TRIM<4>, and a carry output. While illustrated as having five logical adders, in at least some examples a number X of logical adders of the circuit 600 corresponds to a number of bits of LVL<X-1:0>, as discussed elsewhere herein. Turning now to FIG. 7, a diagram 700 of illustrative signal waveforms is shown. In at least some examples, the diagram 700 is representative of at least some signals present in the circuit 200 of FIG. 2, and reference may be made to elements of the circuit 200 in describing the diagram 700. For example, the diagram 700 illustrates Vin, DIV_IN, Vref, COMP_OUT, HV_ENABLE, and SENSE_OUT. As shown in diagram 700, as Vin increases, DIV_IN increases linearly based on a ratio of the voltage divider circuit 206 until DIV_IN exceeds Vref at a time t1. When DIV_IN exceeds Vref at t1, COMP_OUT and SENSE_OUT each transition from logical low to logical high values. In at least some examples, SENSE_OUT transitions from the logical low value to the logical high value with a slight delay in time compared to COMP_OUT. Additionally, at the time t1, DIV_IN is increased non-linearly to provide hysteresis to the determination of COMP_OUT. In at least some examples, the non-linear increase is an increase in value of DIV_IN of about 100 millivolts. At a time t2, Vin exceeds a high-voltage threshold (not shown). When Vin exceeds the high-voltage threshold, HV_ENABLE transitions to a logical high value and DIV_IN falls to approximately zero volts, for example, as a result of high-voltage protection of the voltage divider circuit 206. At a time t3, Vin falls below the high-voltage threshold, HV_ENABLE transitions to a logical low level, and DIV_IN again begins linearly tracking Vin. Additionally, at the time t3, DIV_IN is decreased non-linearly to provide hysteresis to the determination of COMP_OUT. In at least some examples, the non-linear decrease is a decrease of about 100 millivolts. At a time t4, DIV_IN falls below Vref, COMP_OUT and SENSE_OUT each transition from logical high to logical low values. In at least some examples, SENSE_OUT transitions from the logical high value to the logical low value with a slight delay in time compared to COMP_OUT. As illustrated in the diagram 700, DIV_IN includes periodic glitches, or periods where a value of DIV_IN momentarily drops to about zero volts. A duration of each of these glitches may be approximately equal to an amount of time that PMOS_GATE has a logical high value and/or NMOS_ON has a logical high value. In at least some examples, the glitches are not reflected in COMP_OUT because of the glitch immunity of the comparator 210, as discussed above.

Figure 8:
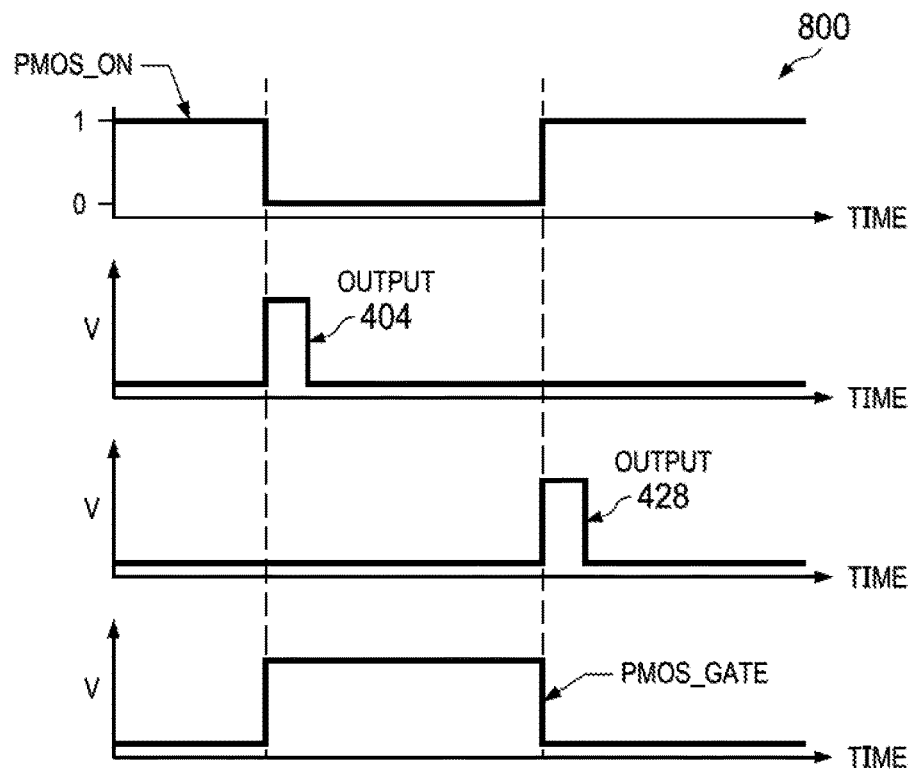
FIG. 8 shows a diagram of illustrative signals in accordance with various examples.

Turning now to FIG. 8, a diagram 800 of illustrative signal waveforms is shown. In at least some examples, the diagram 800 is representative of at least some signals present in the circuit 400 of FIG. 4, and reference may be made to elements of the circuit 400 in describing the diagram 800. For example, the diagram 800 illustrates PMOS_ON, a signal output by the mono shot circuit 404, a signal output by the mono shot circuit 428, and PMOS_GATE. As shown in diagram 800, at a falling edge of PMOS_ON, the mono shot circuit 404 generates a pulse signal that causes the circuit 400 to rapidly increase the value of PMOS_GATE, causing PMOS_GATE to rapidly turn off a p-type FET controlled at a gate terminal by PMOS_GATE. Similarly, at a rising edge of PMOS_ON, the mono shot circuit 428 generates a pulse signal that controls the circuit 400 to rapidly decrease the value of PMOS_GATE, causing PMOS_GATE to rapidly turn on a p-type FET controlled at a gate terminal by PMOS_GATE.

Figure 9:
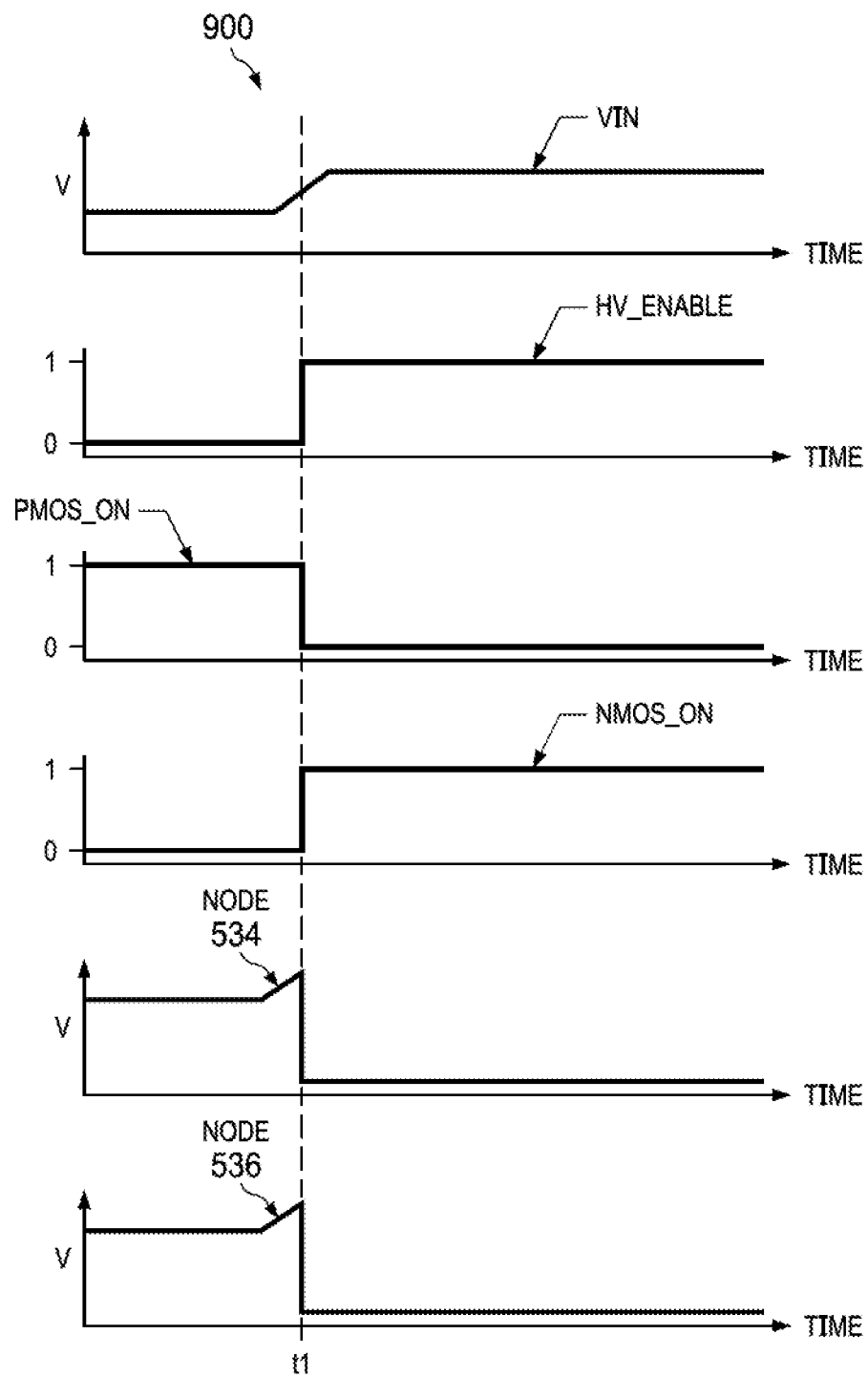
FIG. 9 shows a diagram of illustrative signals in accordance with various examples.

Turning now to FIG. 9, a diagram 900 of illustrative signal waveforms is shown. In at least some examples, the diagram 900 is representative of at least some signals present in the circuit 300 of FIG. 3 or the circuit 500 of FIG. 5, and reference may be made to elements of the circuit 300 or the circuit 500 in describing the diagram 900. For example, the diagram 900 illustrates Vin, HV_ENABLE, PMOS_ON, NMOS_ON, a voltage present at the node 534, and a voltage present at the node 536. As shown in diagram 900, at a time t1 Vin exceeds a threshold for generating HV_ENABLE, causing HV_ENABLE to transition from a logical low value to a logical high value. When HV_ENABLE transitions to the logical high value, PMOS_ON transitions from a logical high value to a logical low value and NMOS_ON transitions from a logical low value to a logical high value. When PMOS_ON transitions to the logical low value and NMOS_ON transitions to the logical high value, the node 534 and the node 536 are discharged.

Figure 10:
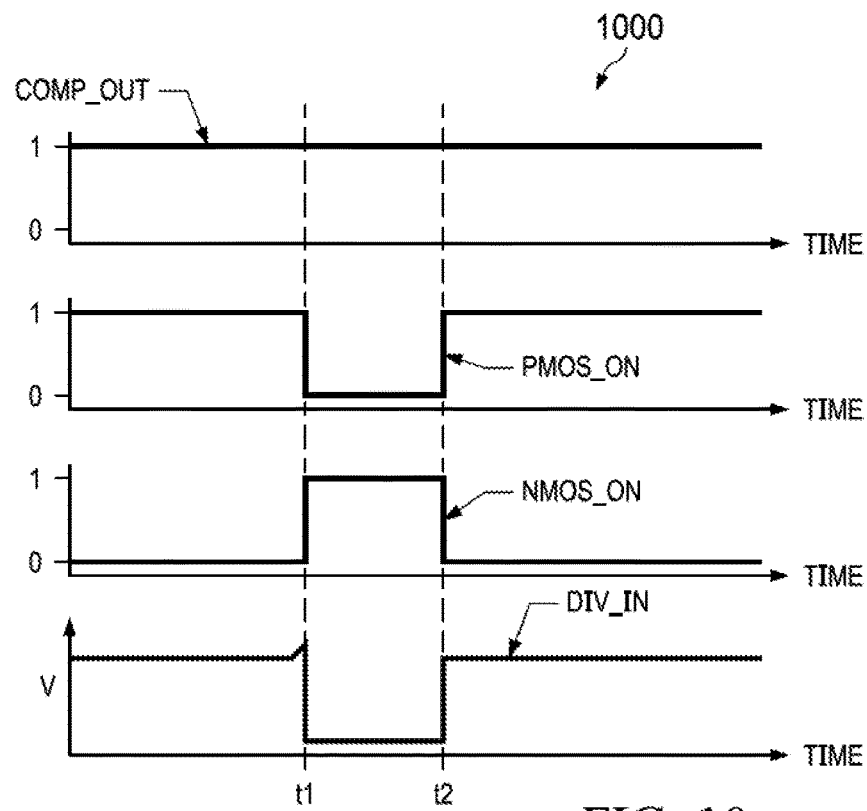
FIG. 10 shows a diagram of illustrative signals in accordance with various examples.

Turning now to FIG. 10, a diagram 1000 of illustrative signal waveforms is shown. In at least some examples, the diagram 1000 is representative of at least some signals present in the circuit 200 of FIG. 2, and reference may be made to elements of the circuit 200 in describing the diagram 1000. For example, the diagram 1000 illustrates COMP_OUT, PMOS_ON, NMOS_ON, and DIV_IN. As shown in diagram 1000, at a time t1 at while PMOS_ON transitions from a logical high value to a logical low value and NMOS_ON transitions from a logical low value to a logical high value, DIV_IN falls to a value of approximately zero. However, COMP_OUT remains unchanged as a result of the glitch immunity of the comparator 210, as discussed throughout the present disclosure. At a time t2, PMOS_ON transitions from the logical low value to the logical high value, NMOS_ON transitions from the logical high value to the logical low value, DIV_IN to approximately a same value as prior to time t1, and COMP_OUT again remains unchanged.

In the foregoing discussion, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., FET, metal oxide semiconductor FET (MOSFET), n-type, p-type, etc.), these components may be exchanged for components of other process technologies (e.g., replace FET and/or MOSFET with bi-polar junction transistor (BJT), replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means +/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit, comprising:
   a Zener diode having a cathode coupled to a voltage input first node and having an anode coupled to a second node;
   a first current source having a first terminal coupled to the second node and having a second terminal coupled to a ground terminal;
   a first n-type field effect transistor (FET) having: a gate terminal coupled to the second node, a source terminal coupled to the ground terminal, and a drain terminal coupled to a fifth node;
   a first inverter circuit having an input coupled to the fifth node and having an output coupled to a high voltage enable output fourth node;
   a second current source having a first terminal coupled to the fifth node and having a second terminal coupled to a supply voltage third node;
   pulse circuitry having an input coupled to the high voltage enable output fourth node and having a precharge input; and
   logic circuitry having an input coupled to the high voltage enable output fourth node and having a sense output.

2. The circuit of claim 1, including:
   a second inverter circuit having an input coupled to a sixth node and having an output, in which the circuit is configured to receive a first control signal the sixth node;
   a first pulse generator having an input coupled to the output of the second inverter circuit and having an output;
   a second n-type FET having: a gate terminal coupled to the output of the first pulse generator, a source terminal coupled to the ground terminal, and a drain terminal;

a resistor having a first terminal coupled to the drain of the second n-type FET and having a second terminal coupled to a seventh node;
a first p-type FET having a gate terminal coupled to the seventh node, a drain terminal coupled to the seventh node, and a source terminal coupled to the first node;
a second p-type FET having: a gate terminal coupled to the seventh node, a drain terminal coupled to an eighth node, and a source terminal coupled to the first node;
a third current source coupled between the first node and the eighth node;
a third n-type FET having: a gate terminal coupled to the sixth node, a drain terminal coupled to the eighth node, and a source terminal;
a fourth current source coupled between the source terminal of the third n-type FET and the ground terminal;
a fourth n-type FET having: a gate terminal, a drain terminal coupled to the source terminal of the third n-type FET, and a source terminal coupled to the ground terminal; and
a second pulse generator having an input coupled to the sixth node and having an output coupled to the gate terminal of the fourth n-type FET.

3. The circuit of claim 2, including:
a third p-type FET having: a gate terminal coupled to the eighth node, a source terminal coupled to the first node, and a drain terminal coupled to a ninth node;
a first capacitor coupled between the ninth node and a tenth node;
a second capacitor coupled between the tenth node and the ground terminal;
a fifth n-type FET having: a gate terminal coupled to an eleventh node, a drain terminal coupled to the ninth node, and a source terminal coupled to the ground terminal, in which the circuit is configured to receive a second control signal at the eleventh node;
a sixth n-type FET having a gate terminal coupled to the eleventh node, a drain terminal coupled to the tenth node, and a source terminal coupled to the ground terminal;
a seventh n-type FET having: a gate terminal, a drain terminal, and a source terminal, the source terminal coupled to the ground terminal, in which the seventh n-type FET is configured to receive a third control signal at its gate terminal; and
a third capacitor coupled between the tenth node and the drain terminal of the seventh n-type FET.

4. The circuit of claim 3, including:
a comparator having: a first input coupled to the tenth node, and a second input in which the comparator is configured to receive a reference signal at its second input, and an output; and
the logic circuitry includes a OR logic circuit having a first input coupled to the output of the comparator and a second input coupled to the fourth node.

5. The circuit of claim 4, including a hysteresis circuit configured to receive an indication of an output signal of the comparator, and to receive a fourth control signal, and to generate the third control signal based at least partially on the output signal of the comparator and the fourth control signal.

6. The circuit of claim 3, in which the pulse circuitry includes a third pulse generator circuit, wherein the third pulse generator circuit is configured to generate the first control signal and the second control signal based at least partially on a signal present at the fourth node and a clock signal received by the third pulse generator circuit, and wherein the first control signal and the second control signal are used to reset the first capacitor and the second capacitor by:
causing the third p-type FET to electrically de-couple the first node from the ninth node;
causing the fifth n-type FET to discharge the ninth node to the ground terminal; and
causing the sixth n-type FET to discharge the tenth node to the ground terminal.

7. The circuit of claim 3, in which, when a value of a signal present at the first node exceeds a threshold established by the Zener diode and the first n-type FET, a signal present at the fourth node is used to perform high-voltage input protection by:
causing the third p-type FET to electrically de-couple the first node from the ninth node;
causing the fifth n-type FET to discharge the ninth node to the ground terminal; and
causing the sixth n-type FET to discharge the tenth node to the ground terminal.

8. A supply voltage supervisor circuit, comprising:
a high-voltage protection circuit having an input coupled to an input voltage terminal, having a supply voltage input, and having a high voltage enable output, the high-voltage protection circuit being configured to determine when a value of an input voltage exceeds a threshold voltage value one or more of the high-voltage protection circuit components;
a gate control circuit having an input coupled to the input voltage terminal, having a first pulse input, and having a gate control output, the gate control circuit being configured to generate a gate control signal for controlling a gate terminal of a transistor based on a received first pulse signal;
a voltage divider circuit having an input coupled to the input voltage terminal, having a second pulse input, having a gate control input coupled to the gate control output, having a trim input, and having a divided input voltage output, the voltage divider circuit being configured to divide an input voltage to generate a divided input voltage signal based on a capacitance ratio of the voltage divider circuit and reset the divided input voltage signal based on a second pulse signal;
a comparator having an input coupled to the divided input voltage output, having a reference voltage input, and having a sense output;
a hysteresis circuit having an input coupled to the sense output, having a voltage division input, and having a trim output; and
a pulse generator circuit having a precharge input, having an input coupled to the high voltage enable output, having a first pulse output coupled to the first pulse input, and having a second pulse output coupled to the second pulse input, the pulse generator circuit being configured to generate the first pulse signal and the second pulse signal.

9. The supply voltage supervisor circuit of claim 8, in which the high-voltage protection circuit includes:
a Zener diode having a cathode coupled to the input voltage terminal and having an anode coupled to a first node;
a first current source having a first terminal coupled to the first node and having a second terminal coupled to a ground terminal;

a first n-type field effect transistor (FET) having: a gate terminal coupled to the first node, a source terminal coupled to the ground terminal, and a drain terminal coupled to a second node;

a first inverter circuit having an input coupled to the second node and an output coupled to a third node; and a second current source having a first terminal coupled to a fourth node and having a second terminal coupled to the second node.

10. The supply voltage supervisor circuit of claim 8, in which the gate control circuit includes:

a second inverter circuit having an input coupled to a fifth node and having an output, in which the fifth node is coupled to the pulse generator circuit and configured to receive the first pulse signal;

a second pulse generator having an input coupled to the output of the second inverter circuit and having an output;

a second n-type field effect transistor (FET) having: a gate terminal coupled to the output of the second pulse generator, a source terminal coupled to a ground terminal, and a drain terminal coupled to a sixth node via a resistor;

a first p-type FET having: a gate terminal coupled to the sixth node, a drain terminal coupled to the sixth node, and a source terminal coupled to the input voltage terminal;

a second p-type FET having: a gate terminal coupled to the sixth node, a drain terminal coupled to a seventh node, and a source terminal coupled to the input voltage terminal;

a third current source coupled between the input voltage terminal and the seventh node;

a third n-type FET having: a gate terminal coupled to the fifth node, a drain terminal coupled to the seventh node, and a source terminal;

a fourth current source coupled between the source terminal of the third n-type FET and the ground terminal;

a fourth n-type FET having: a gate terminal, a drain terminal coupled to the source terminal of the third n-type FET, and a source terminal coupled to the ground terminal; and a third pulse generator having an input coupled to the fifth node and having an output coupled to the gate terminal of the fourth n-type FET.

11. The supply voltage supervisor circuit of claim 8, in which the voltage divider circuit includes:

a third p-type field effect transistor (FET) having: a gate terminal coupled to a seventh node, a source terminal coupled to the input voltage terminal, and a drain terminal coupled to an eighth node;

a first capacitor coupled between the eighth node and a ninth node;

a second capacitor coupled between the ninth node and a ground terminal;

a fifth n-type FET having: a gate terminal coupled to a tenth node, a drain terminal coupled to the eighth node, and a source terminal coupled to the ground terminal, in which the tenth node is coupled to the pulse generator circuit and configured to receive the second control signal;

a sixth n-type FET having: a gate terminal coupled to the tenth node, a drain terminal coupled to the ninth node, and a source terminal coupled to the ground terminal;

a seventh n-type FET having: a gate terminal coupled to an output of the hysteresis circuit and configured to receive the third control signal, a drain terminal, and a source terminal coupled to the ground terminal; and a third capacitor coupled between the ninth node and the drain terminal of the seventh n-type FET.

12. The supply voltage supervisor circuit of claim 11, in which a non-inverting input of the comparator is coupled to the ninth node and the comparator is configured to receive a reference signal (Vref) at an inverting input of the comparator.

13. The supply voltage supervisor circuit of claim 12, including an OR logic gate having: a first input; a second input and an output that is an output of the circuit, in which the OR logic gate is configured to receive an output signal of the comparator at its first input and to receive output signal of the high-voltage protection circuit at its second input.

14. The supply voltage supervisor circuit of claim 8, in which the input voltage is greater in value than an operational tolerance of one or more components of the voltage divider circuit.

15. The supply voltage supervisor circuit of claim 14, in which when the input voltage is greater in value than the operational tolerance of the one or more components of the voltage divider circuit and greater in value than the threshold voltage of the high-voltage protection circuit:

the high-voltage protection circuit generate an output signal (HV_ENABLE) having a logical high value;

the pulse generator circuit generates, based on HV_ENABLE, the first pulse signal having a logical low value and the second pulse signal having a logical high value;

the gate control circuit generates an output signal (PMOS_GATE) based on PMOS_ON and having a logical high value; and the voltage divider circuit discharges DIV_IN based on PMOS_ON, PMOS_GATE, and NMOS_ON.

16. A system, comprising:

a processing element; and a supply voltage supervisor (SVS) circuit, including a voltage sensing circuit configured to detect an under-voltage condition, the voltage sensing circuit including:

a Zener diode having a cathode coupled to a voltage input first node and having an anode coupled to a second node;

a first current source having a first terminal coupled to the second node and having a second terminal coupled to a ground terminal;

a first n-type field effect transistor (FET): having a gate terminal coupled to the second node, a source terminal coupled to the ground terminal, and a drain terminal coupled to a fifth node;

a first inverter circuit having an input coupled to the fifth node and having an output coupled to a high voltage enable output fourth node;

a second current source having a first terminal coupled to the fifth node and having a second terminal coupled to a supply voltage third node;

pulse circuitry having an input coupled to the high voltage enable output fourth node and having a precharge input; and logic circuitry having an input coupled to the high voltage enable output fourth node and having a sense output.

17. The system of claim 16, including gate control circuitry including:

a second inverter circuit having an input coupled to a sixth node and having an output, in which the system is configured to receive a first control signal at the sixth node;

a first pulse generator having an input coupled to the output of the second inverter circuit and having an output;

a second n-type FET having: a gate terminal coupled to the output of the first pulse generator, a source terminal coupled to the ground terminal, and a drain terminal;

a resistor having a first terminal coupled to the drain of the second n-type FET and having a second terminal coupled to a seventh node;

a first p-type FET having: a gate terminal coupled to the seventh node, a drain terminal coupled to the seventh node, and a source terminal coupled to the first node;

a second p-type FET having: a gate terminal coupled to the seventh node, a drain terminal coupled to an eighth node, and a source terminal coupled to the first node;

a third current source coupled between the first node and the eighth node;

a third n-type FET having: a gate terminal coupled to the sixth node, a drain terminal coupled to the eighth node, and a source terminal;

a fourth current source coupled between the source terminal of the third n-type FET and the ground terminal;

a fourth n-type FET having: a gate terminal, a drain terminal coupled to the source terminal of the third n-type FET, and a source terminal coupled to the ground terminal; and a second pulse generator having an input coupled to the sixth node and having an output coupled to the gate terminal of the fourth n-type FET.

18. The system of claim 17, including voltage divider circuitry including:

a third p-type FET having: a gate terminal coupled to the eighth node, a source terminal coupled to the first node, and a drain terminal coupled to a ninth node;

a first capacitor coupled between the ninth node and a tenth node;

a second capacitor coupled between the tenth node and the ground terminal;

a fifth n-type FET having: a gate terminal coupled to an eleventh node, a drain terminal coupled to the ninth node, and a source terminal coupled to the ground terminal, in which the system is configured to receive a second control signal at the eleventh node;

a sixth n-type FET having: a gate terminal coupled to the eleventh node, a drain terminal coupled to the tenth node, and a source terminal coupled to the ground terminal;

a seventh n-type FET having a gate terminal, a drain terminal, and a source terminal, in which the source terminal is coupled to the ground terminal and the seventh n-type FET is configured to receive a third control signal at its gate; and a third capacitor coupled between the tenth node and the drain terminal of the seventh n-type FET.

19. The system of claim 18, including:

a comparator: having a first input coupled to the tenth node, a second input, and an output, in which the comparator is configured to receive a reference signal, and an output; and the logic circuitry including a OR logic circuit having a first input coupled to the output of the comparator and having a second input coupled to the fourth node.

20. The system of claim 19, including:

a hysteresis circuit configured to receive an output signal of the comparator to receive a fourth control signal and to generate the third control signal based at least partially on the output of the comparator and the fourth control signal; and a third pulse generator circuit, wherein the third pulse generator circuit is configured to generate the first control signal and the second control signal based on a signal present at the fourth node indicating that a value of the signal present at the first node exceeds a threshold established by the Zener diode and the first n-type FET or based on a clock signal received by the third pulse generator circuit, and wherein the first control signal and the second control signal are used to reset the first capacitor and the second capacitor by:

causing the third p-type FET to electrically de-couple the first node from the ninth node;

causing the fifth n-type FET to discharge the ninth node to the ground terminal; and causing the sixth n-type FET to discharge the tenth node to the ground terminal.

21. A circuit comprising:

a diode having first and second diode terminals, the first diode terminal coupled to a voltage input terminal;

a first current source having first and second current source terminals, the first current source terminal coupled to the second diode terminal, the second current source terminal coupled to a ground terminal;

a first transistor having a control terminal and having first and second transistor terminals, the control terminal coupled to the second diode terminal and to the first current source terminal, the first transistor terminal coupled to the ground terminal;

an inverter circuit having an input and an output, the input coupled to the second transistor terminal; and a second current source having third and fourth current source terminals, the third current source terminal coupled to the second transistor terminal and to the input of the inverter circuit, the fourth current source terminal coupled to a voltage supply terminal.

* * * * *